United States Patent
Kurosawa et al.

(10) Patent No.: US 6,756,562 B1
(45) Date of Patent: Jun. 29, 2004

(54) SEMICONDUCTOR WAFER DIVIDING APPARATUS AND SEMICONDUCTOR DEVICE MANUFACTURING METHOD

(75) Inventors: Tetsuya Kurosawa, Yokohama (JP); Shinya Takyu, Kitakatsusika gun (JP); Ninao Sato, Mitaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/390,900

(22) Filed: Mar. 19, 2003

(30) Foreign Application Priority Data

Jan. 10, 2003 (JP) .................................. 2003-004767

(51) Int. Cl.$^7$ .............................................. B23K 26/38
(52) U.S. Cl. .............................. 219/121.67; 219/121.72
(58) Field of Search ........................ 219/121.6, 121.67, 219/121.68, 121.69, 121.72, 121.85

(56) References Cited

U.S. PATENT DOCUMENTS

| | | | |
|---|---|---|---|
| 4,224,101 A | 9/1980 | Tijburg et al. | |
| 5,888,883 A | 3/1999 | Sasaki et al. | |
| 6,184,109 B1 | 2/2001 | Sasaki et al. | |
| 6,294,439 B1 | 9/2001 | Sasaki et al. | |
| 6,337,258 B1 * | 1/2002 | Nakayoshi et al. | 438/464 |
| 6,586,707 B2 * | 7/2003 | Boyle et al. | 219/121.69 |

FOREIGN PATENT DOCUMENTS

| | | |
|---|---|---|
| DE | 198 11 115 A1 | 9/1999 |
| DE | 198 410 508 A1 | 12/1999 |
| EP | 1 022 778 A1 | 7/2000 |
| EP | 1 026 735 A2 | 8/2000 |
| JP | 5-54262 | 8/1993 |
| JP | 2002-192367 | 7/2002 |

OTHER PUBLICATIONS

Shinya Takyu et al., "Wafer Splitting Method Using Cleavage", Ser. No. 10/306,008, filed Nov. 29, 2002.

* cited by examiner

*Primary Examiner*—Samuel M. Heinrich
(74) *Attorney, Agent, or Firm*—Finnegan, Henderson, Farabow, Garrett & Dunner, L.L.P.

(57) ABSTRACT

A semiconductor device manufacturing apparatus includes a damage forming equipment, dividing equipment and removing equipment. The damage forming equipment forms damage layers used as starting points to divide a semiconductor wafer into discrete semiconductor chips on a rear surface side of the semiconductor wafer which is opposite to an element forming surface. The dividing equipment divides the semiconductor wafer into discrete semiconductor chips with the damage layers used as the starting points. The removing equipment removes a rear surface portion of the semiconductor wafer to at least a depth where the damage layers are no more present.

26 Claims, 6 Drawing Sheets

FIG. 23
31: Cooling bath  32: Controller  33: Ice plate

SEMICONDUCTOR WAFER DIVIDING APPARATUS AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2003-004767, filed Jan. 10, 2003, the entire contents of which are incorporated herein by reference.

BACKGROUND OF THE INVENTION

1. Field of the Invention

This invention relates to a semiconductor device manufacturing method and apparatus to discretely divide a semiconductor wafer into semiconductor chips (semiconductor elements) after elements are formed in the semiconductor wafer and more particularly to a technique for discretely dividing the semiconductor wafer.

2. Description of the Related Art

Conventionally, when a semiconductor wafer on which elements have been formed is discretely divided to form semiconductor chips, mechanical cutting (dividing by cutting using a diamond blade or grindstone), dividing by forming cut grooves and breaking, dividing by breaking with distortions and scratches used as starting points by use of a scriber (refer to Jpn. Pat. Appln. KOKOKU Publication No. H05-54262, for example), cutting by application of a laser beam, dividing by use of a combination of application of a laser beam and distortion (refer to Jpn. Pat. Appln. KOKAI Publication No. P2002-192367, for example) and the like are used.

Figures 1A, 1B, 5, 6, 7, 8:
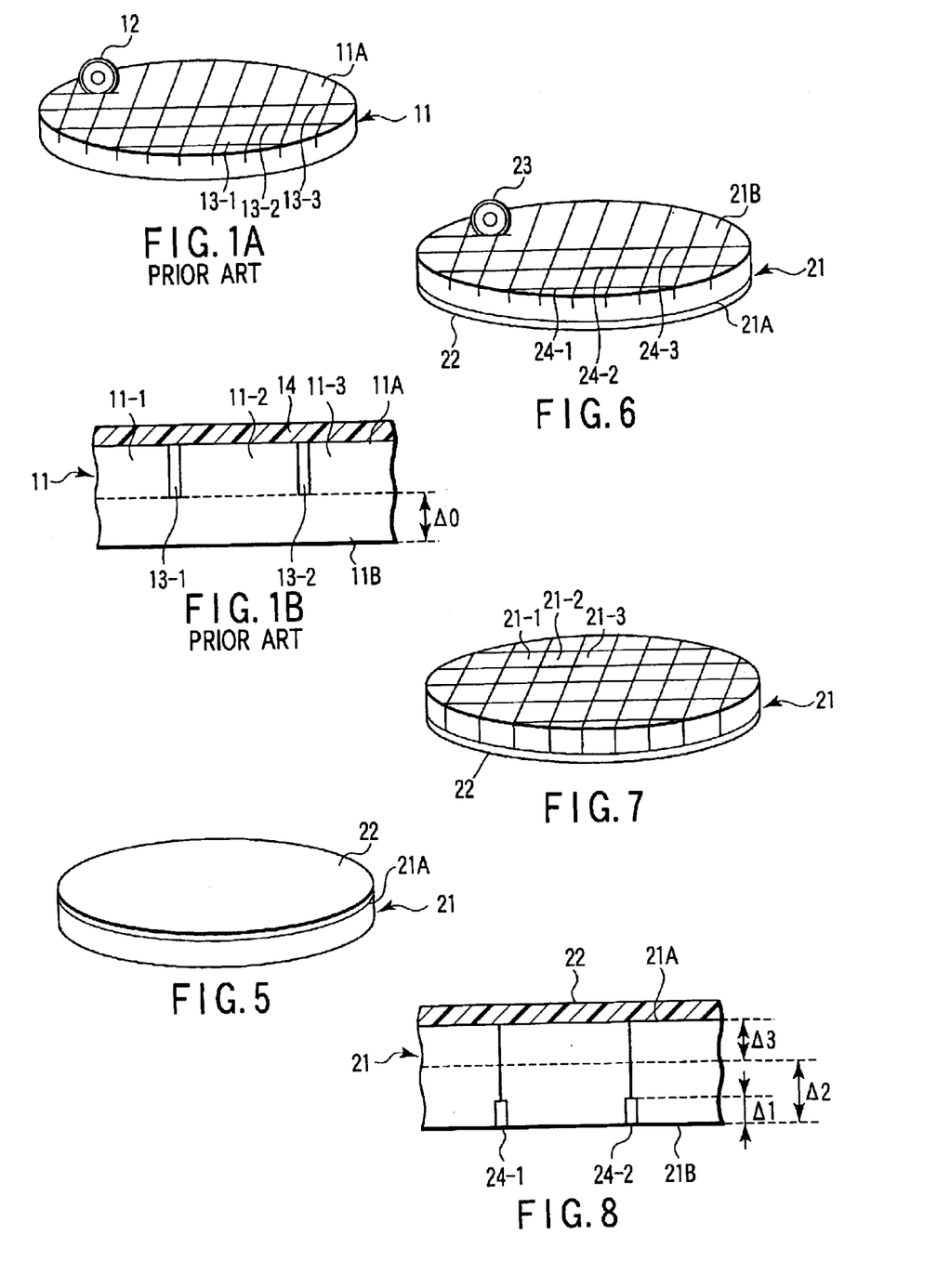
FIG. 1A is a perspective view showing a step of forming cut grooves in a semiconductor wafer by use of a diamond blade and showing an extracted part of a conventional semiconductor device manufacturing process.
FIG. 1B is a cross sectional view showing a back-side grinding step and showing an extracted part of a conventional semiconductor device manufacturing process.
FIG. 5 is a perspective view showing a dicing tape affixing step, for illustrating a semiconductor device manufacturing method and apparatus according to a first embodiment of the present invention.
FIG. 6 is a perspective view showing a step of forming cut grooves used as division starting points, for illustrating the semiconductor device manufacturing method and apparatus according to the first embodiment of the present invention.
FIG. 7 is a perspective view showing a wafer dividing step, for illustrating the semiconductor device manufacturing method and apparatus according to the first embodiment of the present invention.
FIG. 8 is a cross sectional view showing a back-side grinding step, for illustrating the semiconductor device manufacturing method and apparatus according to the first embodiment of the present invention.

FIGS. 1A and 1B show an extracted part of the conventional semiconductor device manufacturing process described above, FIG. 1A being a perspective view showing a step of forming cut grooves in a semiconductor wafer by use of a diamond blade and FIG. 1B being a cross sectional view showing a back-side grinding step. First, as shown in FIG. 1A, grooves 13-1, 13-2, 13-3, . . . for dividing are formed (half-cut) along dicing lines or chip dividing lines on an element forming surface 11A side of a semiconductor wafer 11 on which elements have been formed. After this, a protection film 14 is affixed to the element forming surface 11A of the semiconductor wafer 11 and then, as shown in FIG. 1B, a rear surface portion 11B of the semiconductor wafer 11 is ground to at least a depth Δ0 which reaches the grooves 13-1, 13-2, 13-3, . . . to divide the semiconductor wafer 11 into discrete semiconductor chips 11-1, 11-2, 11-3, . . . .

Alternatively, a dicing tape is affixed to the rear surface 11B of the semiconductor wafer 11 which is opposite to the element forming surface 11A and the semiconductor wafer is cut (full cut) along the dicing lines or chip dividing lines by use of the diamond blade 12 in some cases.

Figure 2A:
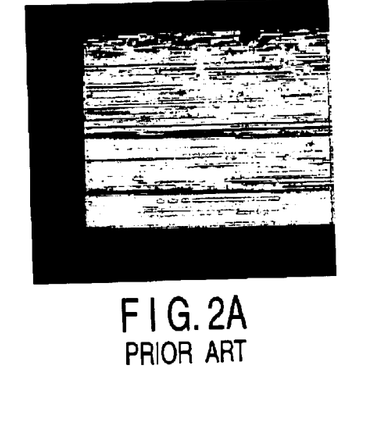
FIG. 2A is a microphotograph of the side surface of a semiconductor chip when a semiconductor wafer is divided by blade dicing.
Figure 2B:
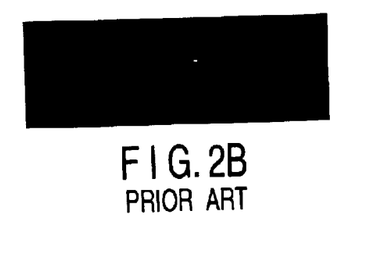
FIG. 2B is a microphotograph of the element forming surface side when a semiconductor wafer is divided by blade dicing.

However, in the mechanical cutting process such as the blade dicing process, cutting streaks (scratches or distortions) may occur on the side surface of the semiconductor chip as shown in FIG. 2A. Further, chippings may occur on the element forming surface (also on the rear surface in the case of full cut) as shown in FIG. 2B.

Figure 3A:
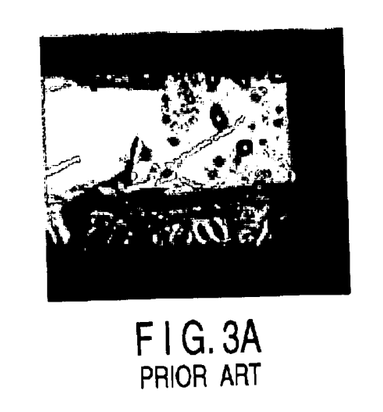
FIG. 3A is a microphotograph of the side surface of a semiconductor chip when a semiconductor wafer is divided by use of a scriber.
Figure 3B:
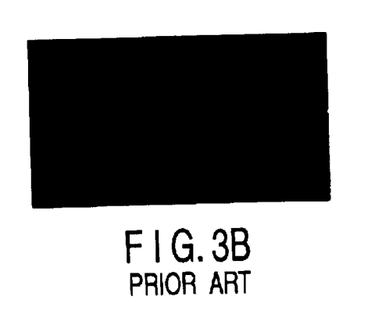
FIG. 3B is a microphotograph of the element forming surface side when a semiconductor wafer is divided by use of a scriber.

This applies to a case wherein scratches or distortions are formed by use of a scriber and the semiconductor wafer is divided by breaking and, as shown in FIG. 3A, scratches (less than 5 μm) or distortions (approximately several μm) may occur on the side surface of the semiconductor chip. Further, as shown in FIG. 3B, chippings may occur on the element forming surface.

Figure 4A:
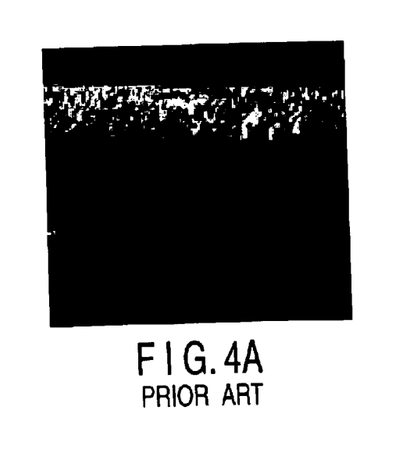
FIG. 4A is a microphotograph of the side surface of a semiconductor chip when a semiconductor wafer is divided by application of a laser beam.
Figure 4B:
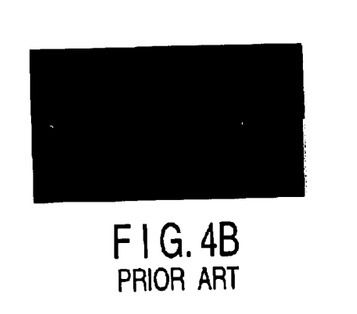
FIG. 4B is a microphotograph of the element forming surface side when a semiconductor wafer is divided by application of a laser beam.

In the cutting process by application of a laser beam, occurrence of cutting streaks and chippings by mechanical cutting can be prevented, but distortions (damages) occur on the side surface of the semiconductor chip as shown in FIG. 4A. Further, as shown in FIG. 4B, the side surface of the semiconductor chip becomes uneven and the mechanical strength is lowered. In addition, melted Si is re-crystallized so that adjacent elements will tend to interfere with each other, thereby causing chippings to occur. Further, there occurs a problem that the element characteristic is deteriorated (for example, the pause characteristic of a DRAM is degraded) or a melted portion is attached to the wiring surface by heat generated at the time of laser application.

Thus, in the conventional semiconductor device manufacturing method and apparatus, when the semiconductor wafer is cut and divided into discrete semiconductor chips, cutting streaks (scratches or distortions) may occur on the side surface of the semiconductor chip, damages by heat may occur, the characteristic of the semiconductor chip may be deteriorated, faults may occur and the resistance to bending or breaking may be lowered. Further, even if the semiconductor chip does not become faulty, cutting streaks and uneven portions caused by application of the laser beam will remain on the peripheral portion of the semiconductor chip and the shape and quality thereof are poor.

BRIEF SUMMARY OF THE INVENTION

A semiconductor device manufacturing apparatus according to an aspect of the invention comprises a damage forming equipment which forms damage layers used as starting points to divide a semiconductor wafer into discrete semiconductor chips on a rear surface side of the semiconductor wafer which is opposite to an element forming surface, a dividing equipment which divides the semiconductor wafer into discrete semiconductor chips with the damage layers used as the starting points, and a removing equipment which removes a rear surface portion of the semiconductor wafer to at least a depth where the damage layers are no more present.

A semiconductor device manufacturing method according to another aspect of the invention comprises forming a damage layer used as starting points to divide a semiconductor wafer into discrete semiconductor chips on a rear surface side of the semiconductor wafer which is opposite to an element forming surface, dividing the semiconductor wafer into discrete semiconductor chips with the damage layer used as the starting points, and removing a rear surface portion of the semiconductor wafer to at least a depth where the damage layer is no more present.

DETAILED DESCRIPTION OF THE INVENTION

First Embodiment

FIGS. 5 to 9 sequentially show parts of a manufacturing process and parts of a manufacturing apparatus, for illustrating a semiconductor device manufacturing method and apparatus according to a first embodiment of the present invention.

First, as shown in FIG. 5, a dicing tape (protection member, protection tape or holding tape) 22 is affixed to an element forming surface 21A side of a semiconductor wafer 21 on which elements have been formed.

Next, as shown in FIG. 6, grooves (damage layers) 24-1, 24-2, 24-3, . . . used as starting points to divide the semiconductor wafer into discrete semiconductor chips are formed on a rear surface 21B side of the semiconductor wafer 21 which is opposite to the element forming surface 21A by use of a diamond blade 23. The grooves 24-1, 24-2, 24-3, . . . are formed shallower than the thickness of the semiconductor chip obtained at the time of completion. Further, it is preferable to form the grooves 24-1, 24-2, 24-3, . . . in a direction corresponding to the crystallization direction of the semiconductor wafer (for example, Si) since the grooves are used as the starting points of cleavage.

Next, as shown in FIG. 7, a breaking process is performed to cleave the semiconductor wafer 21 by using the grooves 24-1, 24-2, 24-3, . . . as the starting points to form discrete semiconductor chips 21-1, 21-2, 21-3, . . . .

After this, as shown in FIG. 8, a portion on the rear surface 21B side of the discretely divided semiconductor wafer 21 is ground and removed until the semiconductor wafer comes to have preset thickness. If the depth of the grooves 24-1, 24-2, 24-3, . . . is $\Delta 1$ and the grinding amount is $\Delta 2$, then damage layers such as scratches or distortions formed on the side surfaces of the semiconductor chips 21-1, 21-2, 21-3, . . . by forming the grooves 24-1, 24-2, 24-3, . . . can be removed by setting up the relation of $\Delta 1 < \Delta 2$. For example, since the wafer thickness is 725 $\mu$m in the case of an 8-inch semiconductor wafer, $\Delta 2$ becomes equal to 695 to 275 $\mu$m if the final thickness $\Delta 3$ of the semiconductor chips 21-1, 21-2, 21-3, . . . is 30 to 450 $\mu$m and therefore the depth $\Delta 1$ of the grooves 24-1, 24-2, 24-3, . . . can be freely and selectively set in a range shallower than 695 to 275 $\mu$m.

Figure 9:
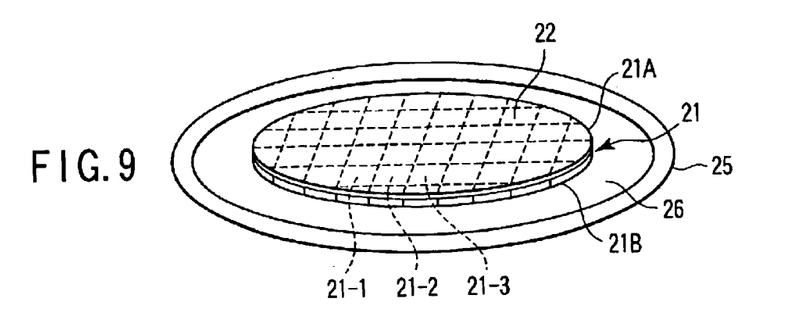
FIG. 9 is a perspective view showing a pickup tape affixing step, for illustrating the semiconductor device manufacturing method and apparatus according to the first embodiment of the present invention.

Next, as shown in FIG. 9, after a pickup tape 26 mounted on a wafer ring 25 is affixed to the rear surface of the semiconductor wafer 21, the protection tape 22 on the element forming surface 21A side is peeled.

Then, the semiconductor chips 21-1, 21-2, 21-3, . . . picked up by use of a picker are mounted on lead frames or TAB tapes and sealed into resin or ceramic packages, respectively, to complete semiconductor devices.

Figure 10A:
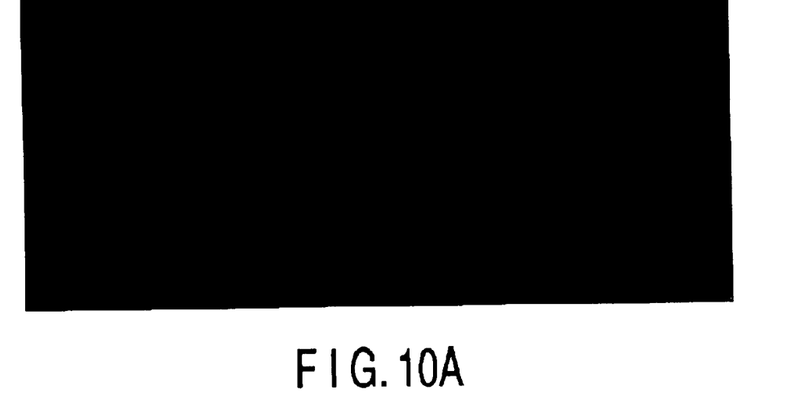
FIG. 10A is a microphotograph of the element forming surface side of a mirror-finished portion of a semiconductor chip formed by the semiconductor device manufacturing method and apparatus according to the first embodiment of the present invention.
Figure 10B:
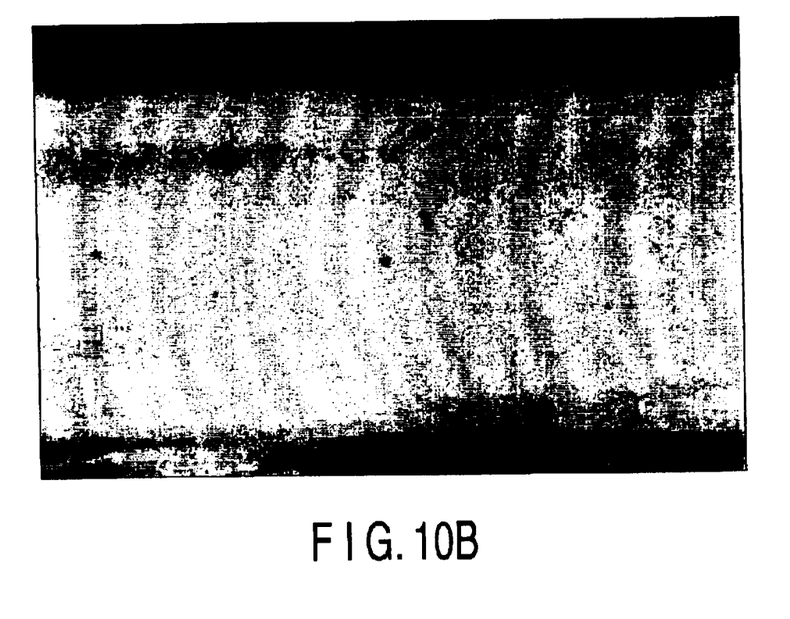
FIG. 10B is a microphotograph of the side surface of a semiconductor chip formed by the semiconductor device manufacturing method and apparatus according to the first embodiment of the present invention.

According to the manufacturing method and the apparatus with the above configuration, since the grooves 24-1, 24-2, 24-3, . . . are formed in a region (discarding portion) which is to be removed in the back-side grinding process, the damage layers are not left behind on the semiconductor chips 21-1, 21-2, 21-3, . . . obtained after the back-side grinding process and occurrence of distortion of Si and minute cracks of the separation surface and edge portion can be prevented. Further, since the side surface of the semiconductor chip sealed into the package is a cleavage plane, uneven portions and scratches are not formed on the element forming surface and side surface of the semiconductor chip and the quality and shape thereof are good as shown in FIGS. 10A and 10B.

Therefore, a deterioration in the characteristic of the semiconductor chip, occurrence of faults and a lowering in the resistance to bending or breaking can be suppressed.

Second Embodiment

FIGS. 11 to 15 sequentially show parts of a manufacturing process and parts of a manufacturing apparatus, for illustrating a semiconductor device manufacturing method and apparatus according to a second embodiment of the present invention.

Figure 11:
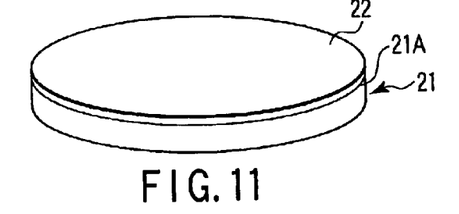
FIG. 11 is a perspective view showing a dicing tape affixing step, for illustrating a semiconductor device manufacturing method and apparatus according to a second embodiment of the present invention.

First, as shown in FIG. 11, a dicing tape (protection member, protection tape or holding tape) 22 is affixed to an element forming surface 21A side of a semiconductor wafer 21 on which elements have been formed.

Figure 12:
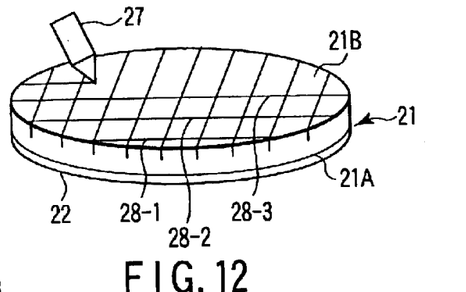
FIG. 12 is a perspective view showing a step of forming scratches or distortions used as division starting points, for illustrating the semiconductor device manufacturing method and apparatus according to the second embodiment of the present invention.

Next, as shown in FIG. 12, scratches or distortions (damage layers) 28-1, 28-2, 28-3, . . . used as starting points to divide the semiconductor wafer into discrete semiconductor chips are formed on a rear surface 21B side of the semiconductor wafer 21 which is opposite to the element forming surface 21A by use of a diamond scriber 27. The scratches or distortions 28-1, 28-2, 28-3, . . . are formed shallower than the thickness of the semiconductor chip obtained at the time of completion. Further, it is preferable to form the scratches or distortions 28-1, 28-2, 28-3, . . . in a direction corresponding to the crystallization direction of the semiconductor wafer (for example, Si) since the scratches or distortions are used as the starting points of cleavage.

Figure 13:
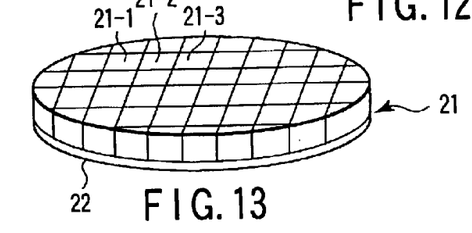
FIG. 13 is a perspective view showing a wafer dividing step, for illustrating the semiconductor device manufacturing method and apparatus according to the second embodiment of the present invention.

Next, as shown in FIG. 13, a breaking process is performed to cleave the semiconductor wafer 21 by using the scratches or distortions 28-1, 28-2, 28-3, . . . as the starting points to form discrete semiconductor chips 21-1, 21-2, 21-3, . . . .

Figure 14:
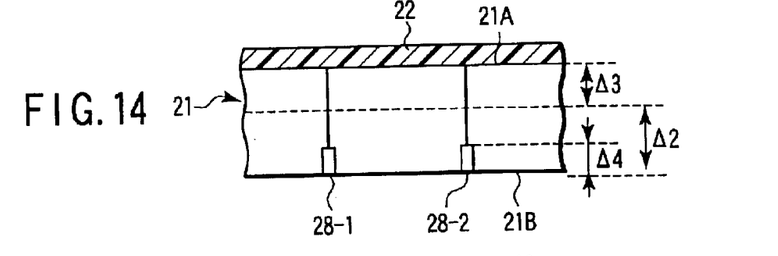
FIG. 14 is a cross sectional view showing a back-side grinding step, for illustrating the semiconductor device manufacturing method and apparatus according to the second embodiment of the present invention.

After this, as shown in FIG. 14, a portion on the rear surface 21B side of the discretely divided semiconductor wafer 21 is ground and removed until the semiconductor wafer comes to have preset thickness. If the depth of the scratches or distortions 28-1, 28-2, 28-3, . . . is $\Delta 4$ and the grinding amount is $\Delta 2$, then damage layers such as scratches or distortions formed on the side surfaces of the semiconductor chips 21-1, 21-2, 21-3, . . . can be removed by setting up the relation of $\Delta 4 < \Delta 2$. Since the wafer thickness is 725 $\mu$m in the case of an 8-inch semiconductor wafer, for example, $\Delta 2$ becomes equal to 695 to 275 $\mu$m if the final thickness $\Delta 3$ of the semiconductor chips 21-1, 21-2, 21-3, . . . is 30 to 450 $\mu$m and therefore the depth $\Delta 4$ of the scratches or distortions 28-1, 28-2, 28-3, . . . can be freely and selectively set in a range shallower than 695 to 275 $\mu$m.

Figure 15:
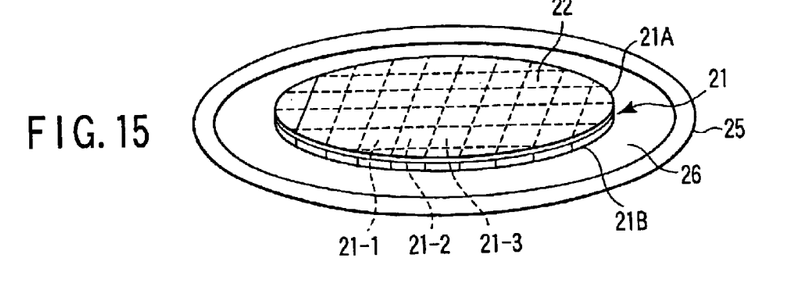
FIG. 15 is a perspective view showing a pickup tape affixing step, for illustrating the semiconductor device manufacturing method and apparatus according to the second embodiment of the present invention.

Next, as shown in FIG. 15, after a pickup tape 26 mounted on a wafer ring 25 is affixed to the rear surface of the semiconductor wafer 21, the protection tape 22 on the element forming surface 21A side is peeled.

Then, the semiconductor chips 21-1, 21-2, 21-3, . . . picked up by use of a picker are mounted on lead frames or TAB tapes and sealed into resin or ceramic packages, respectively, to complete semiconductor devices.

According to the apparatus with the above configuration and the manufacturing method, since the scratches or distortions 28-1, 28-2, 28-3, . . . are formed in a region (discarding portion) which is to be removed in the back-side grinding process, damage layers are not left behind after the back-side grinding process and occurrence of distortion of Si and minute cracks of the separation surface and edge portion can be prevented. Further, since the side surface of the semiconductor chip sealed into the package is a cleavage plane, uneven portions and scratches are not formed on the element forming surface and side surface of the semiconductor chip and the quality and shape thereof are good.

Therefore, a deterioration in the characteristic of the semiconductor chip, occurrence of faults and a lowering in the resistance to bending or breaking can be suppressed.

Third Embodiment

FIGS. 16 to 20 sequentially show parts of a manufacturing process and parts of a manufacturing apparatus, for illustrating a semiconductor device manufacturing method and apparatus according to a third embodiment of the present invention.

Figure 16:
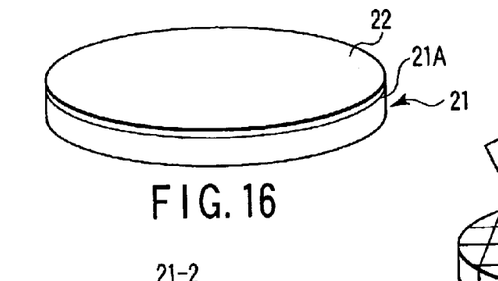
FIG. 16 is a perspective view showing a dicing tape affixing step, for illustrating a semiconductor device manufacturing method and apparatus according to a third embodiment of the present invention.

First, as shown in FIG. 16, a dicing tape (protection member, protection tape or holding tape) 22 is affixed to an element forming surface 21A side of a semiconductor wafer 21 on which elements have been formed.

Figure 17:
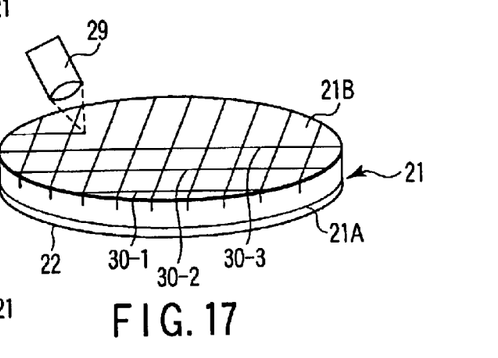
FIG. 17 is a perspective view showing a step of forming re-crystallization layers used as division starting points, for illustrating the semiconductor device manufacturing method and apparatus according to the third embodiment of the present invention.

Next, as shown in FIG. 17, Si re-crystallization layers (damage layers) 30-1, 30-2, 30-3, . . . used as starting points to divide the semiconductor wafer into discrete semiconductor chips are formed on a rear surface 21B side of the semiconductor wafer 21 which is opposite to the element forming surface 21A by irradiating a laser beam from a laser irradiation device 29. The re-crystallization layers 30-1, 30-2, 30-3, . . . are formed shallower than the thickness of the semiconductor chip obtained at the time of completion. Further, it is preferable to form the re-crystallization layers 30-1, 30-2, 30-3, . . . in a direction corresponding to the crystallization direction of the semiconductor wafer (for example, Si) since the re-crystallization layers are used as the starting points of cleavage.

Figure 18:
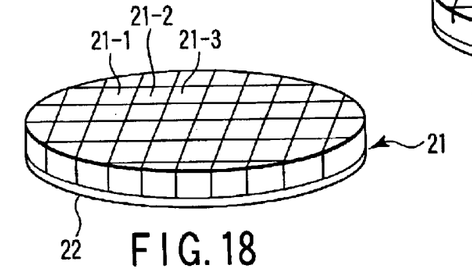
FIG. 18 is a perspective view showing a wafer dividing step, for illustrating the semiconductor device manufacturing method and apparatus according to the third embodiment of the present invention.

Next, as shown in FIG. 18, a breaking process is performed to cleave the semiconductor wafer 21 by using the re-crystallization layers 30-1, 30-2, 30-3, . . . as the starting points to form discrete semiconductor chips 21-1, 21-2, 21-3, . . . .

Figure 19:
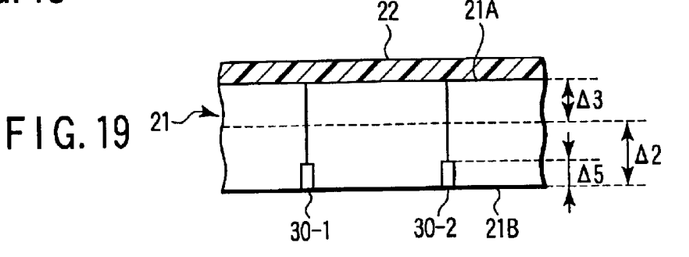
FIG. 19 is a cross sectional view showing a back-side grinding step, for illustrating the semiconductor device manufacturing method and apparatus according to the third embodiment of the present invention.

After this, as shown in FIG. 19, a portion on the rear surface 21B side of the discretely divided semiconductor wafer 21 is ground and removed until the semiconductor wafer comes to have preset thickness. If the depth of the re-crystallization.layers 30-1, 30-2, 30-3, . . . is $\Delta 5$ and the grinding amount is $\Delta 2$, then damage layers formed on the side surfaces of the semiconductor chips 21-1, 21-2, 21-3, . . . by forming the re-crystallization layers 30-1, 30-2, 30-3, . . . can be removed by setting up the relation of $\Delta 5 < \Delta 2$. Since the wafer thickness is 725 $\mu$m in the case of an 8-inch semiconductor wafer, for example, $\Delta 2$ becomes equal to 695 to 275 $\mu$m if the final thickness $\Delta 3$ of the semiconductor chips 21-1, 21-2, 21-3, . . . is 30 to 450 $\mu$m and therefore the depth $\Delta 5$ of the re-crystallization layers 30-1, 30-2, 30-3, . . . can be freely and selectively set in a range shallower than 695 to 275 $\mu$m.

Figure 20:
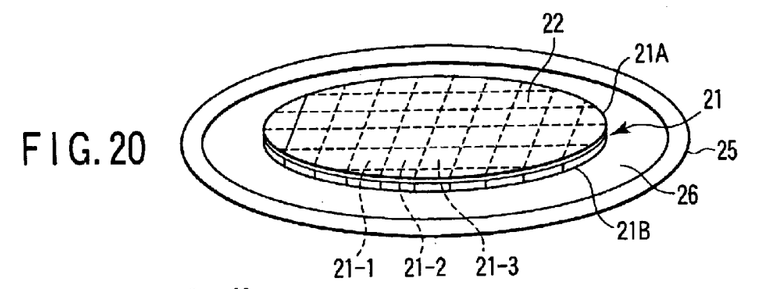
FIG. 20 is a perspective view showing a pickup tape affixing step, for illustrating the semiconductor device manufacturing method and apparatus according to the third embodiment of the present invention.

Next, as shown in FIG. 20, after a pickup tape 26 mounted on a wafer ring 25 is affixed to the rear surface of the semiconductor wafer 21, the protection tape 22 on the element forming surface 21A side is peeled.

Then, the semiconductor chips 21-1, 21-2, 21-3, . . . picked up by use of a picker are mounted on lead frames or TAB tapes and sealed into resin or ceramic packages, respectively, to complete semiconductor devices.

According to the apparatus with the above configuration and the manufacturing method, since the Si re-crystallization layers 30-1, 30-2, 30-3, . . . are formed in a region (discarding portion) which is to be removed in the back-side grinding process, damage layers are not left behind after the back-side grinding process and occurrence of distortion of Si and minute cracks of the separation surface and edge portion can be prevented. Further, since the side surface of the semiconductor chip sealed into the package is a cleavage plane, uneven portions and scratches are not formed on the element forming surface and side surface of the semiconductor chip and the quality and shape thereof are good.

Therefore, a deterioration in the characteristic of the semiconductor chip, occurrence of faults and a lowering in the resistance to bending or breaking can be suppressed.

Fourth Embodiment

Figure 21:
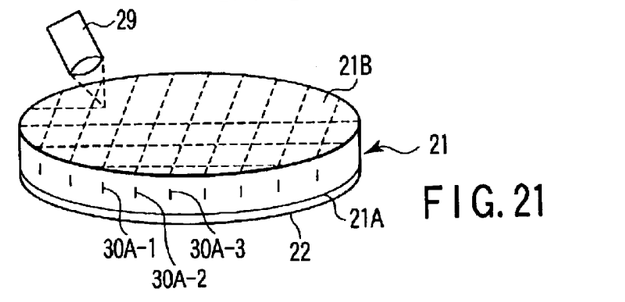
FIG. 21 is a perspective view showing a step of forming re-crystallization layers used as division starting points, for illustrating a semiconductor device manufacturing method and apparatus according to a fourth embodiment of the present invention.
Figure 22:
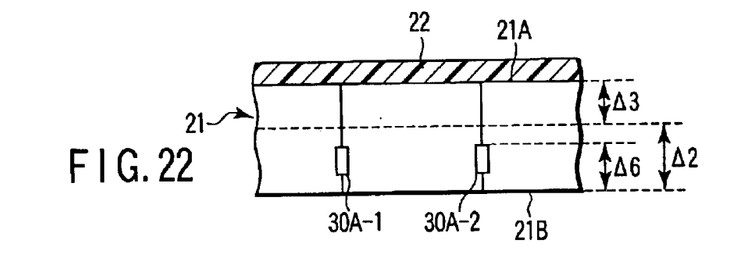
FIG. 22 is a cross sectional view showing a back-side grinding step, for illustrating the semiconductor device manufacturing method and apparatus according to the fourth embodiment of the present invention.

FIGS. 21 and 22 sequentially show parts of a manufacturing process and parts of a manufacturing apparatus, for illustrating a semiconductor device manufacturing method and apparatus according to a fourth embodiment of the present invention.

In the fourth embodiment, silicon re-crystallization regions 30A-1, 30A-2, 30A-3, . . . are formed in a semiconductor wafer 21 by focusing a laser beam on the internal portion of the semiconductor wafer 21 and adjusting laser beam power when the laser beam is applied.

Thus, in a case where the silicon re-crystallization regions are formed in the semiconductor wafer, damage layers can be removed by setting up the relation of $\Delta 6 < \Delta 2$ when the depth of the re-crystallization regions 30A-1, 30A-2, 30A-3, . . . is $\Delta 6$ and the grinding amount is $\Delta 2$.

Therefore, the same operation and effect as those of the firs to third embodiments can be attained.

Fifth Embodiment

Figure 23:
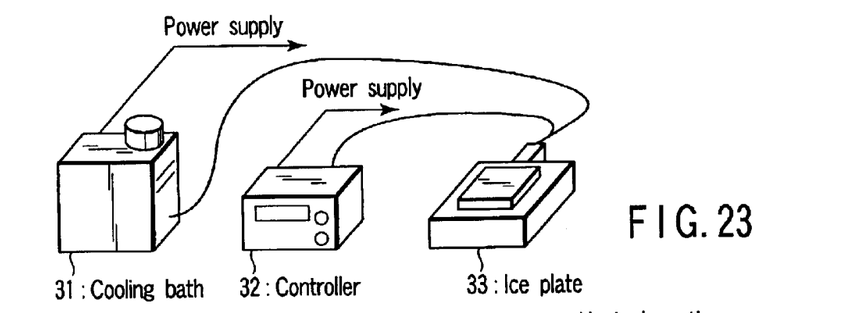
FIG. 23 is a schematic view showing an ice chuck, for illustrating a semiconductor device manufacturing method and apparatus according to a fifth embodiment of the present invention.
Figures 24, 25, 26:
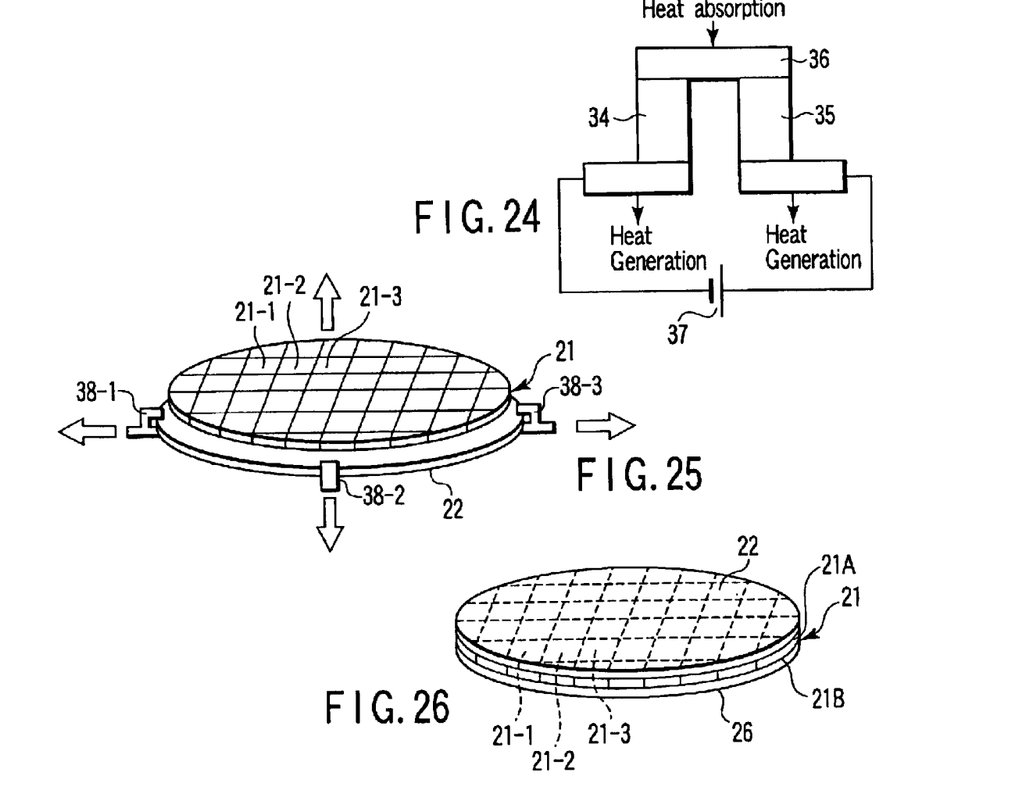
FIG. 24 is a schematic view showing another example of the ice chuck, for illustrating the semiconductor device manufacturing method and apparatus according to the fifth embodiment of the present invention.
FIG. 25 is a perspective view showing part of a manufacturing process and a manufacturing apparatus, for illustrating a semiconductor device manufacturing method and apparatus according to a sixth embodiment of the present invention.
FIG. 26 is a perspective view showing part of a manufacturing process, for illustrating a semiconductor device manufacturing method and apparatus according to a seventh embodiment of the present invention.

FIGS. 23 and 24 sequentially show parts of a manufacturing apparatus, for illustrating a semiconductor device manufacturing method and apparatus according to a fifth embodiment of the present invention.

In the third and fourth embodiments, the silicon re-crystallization layers 30-1, 30-2, 30-3, . . . or 30A-1, 30A-2, 30A-3, . . . are formed in the semiconductor wafer 21 by irradiating the laser beam. However, there occurs a possibility that laser processing gives a bad influence on the semiconductor chip by generation of heat.

Therefore, in the fifth embodiment, the semiconductor wafer 21 is held by use of an ice chuck shown in FIG. 23 and a laser beam is applied to the semiconductor wafer 21 while it is set in a cooled state.

The ice chuck shown in FIG. 23 includes a cooling bath 31, controller 32 and ice plate 33. A refrigerant is supplied from the cooling bath 32 to the ice plate 33 to cool the same. The semiconductor wafer 21 is held on the ice plate 33 and cooled. The temperature of the ice plate 33 is controlled in a temperature range of approximately $-40°$ C. to $5°$ C. by the controller 32.

According to the manufacturing method and the apparatus with the above configuration, an influence of heat given to the semiconductor chip at the time of laser processing can be significantly reduced and occurrence of an operation failure of the semiconductor chip, for example, a degraded pause characteristic of a DRAM can be suppressed.

The ice chuck is not limited to the configuration containing the cooling bath 31 as shown in FIG. 23 and can be provided with a thermoelectric cooling unit using a Peltier element as shown in FIG. 24. The Peltier element includes a P-type element 34, N-type element 35 and metal electrode 36. Voltage is applied to the Peltier element from a power supply 37 to generate or absorb heat by causing a current to flow across the contact surface between the different types of metals.

The ice chuck using the Peltier element makes it easy to control temperatures and cool an object to a set temperature in a short period of time.

Sixth Embodiment

FIG. 25 is a perspective view showing part of a manufacturing process and a manufacturing apparatus, for illustrating a semiconductor device manufacturing method and apparatus according to a sixth embodiment of the present invention.

In the first to third embodiments, the semiconductor wafer is divided by cleavage and breaking. In the sixth embodiment, a dicing tape 22 is stretched in directions indicated by arrows in the drawing by use of stretching jigs 38-1, 38-2, 38-3, . . . to divide the semiconductor wafer by using grooves 24-1, 24-2, 24-3, ..., scratches or distortions 28-1, 28-2, 28-3, ..., re-crystallization layers 30-1, 30-2, 30-3, ..., or re-crystallization layers 30A-1, 30A-2, 30A-3, ... as starting points.

Thus, the semiconductor wafer 21 can be divided into discrete semiconductor chips 21-1, 21-2, 21-3, ... by stretching the dicing tape 22.

Seventh Embodiment

FIG. 26 is a perspective view showing part of a manufacturing process, for illustrating a semiconductor device manufacturing method and apparatus according to a seventh embodiment of the present invention.

In each of the above embodiments, a case where the wafer ring 25 is used when the pickup tape 26 is affixed is explained as an example. However, as shown in FIG. 26, a pickup tape 26 can be affixed and used instead of the dicing tape 22 without using a wafer ring 25.

This invention is not limited to the first to seventh embodiments and can be variously modified without departing from the technical scope thereof.

Various modifications are explained in detail below.

[Modification 1]

In the first to third embodiments, only the dicing tape 22 is affixed to the element forming surface 21A of the semiconductor wafer 21, but it is possible to affix a dicing tape 22 mounted on a wafer ring.

The wafer ring can be used depending on the configuration of the manufacturing apparatus or the like.

[Modification 2]

In the first to third embodiments, since scratches or chippings which may occur at the time of back-side grinding of the semiconductor chip can be removed with higher precision if the grinding surface is etched (for example, by dry etching, wet etching, gas etching, CMP) after back-side grinding, the resistance to bending or breaking at the time of picking-up of the semiconductor chip can be enhanced.

[Modification 3]

In the first to third embodiments, the rear surface portion of the semiconductor wafer can be removed only by etching if the amount of grinding of the rear surface portion is small.

[Modification 4]

The dividing direction of the semiconductor wafer can be set in a direction perpendicular to the rear surface of the wafer or in the same direction as the Si crystallization direction.

[Modification 5]

The damage layers such as the grooves 24-1, 24-2, 24-3, ... scratches or distortions 28-1, 28-2, 28-3, ..., re-crystallization layers 30-1, 30-2, 30-3, ..., or re-crystallization layers 30A-1, 30A-2, 30A-3, ... are formed while the dicing tape is kept affixed to the element forming surface side of the semiconductor wafer. However, the damage layers can be formed without using the dicing tape, a protection tape 22 is affixed to the element forming surface 21A before the semiconductor wafer 21 is divided, and then the semiconductor wafer 21 can be divided by breaking and cleaving or by stretching the protection tape 22.

[Modification 6]

A case wherein the protection tape 22 is affixed to the element forming surface 21A side of the semiconductor wafer 21 is explained as an example, but it is possible to affix a protection member other than the tape. For example, adhesive resin is coated on the element forming surface 21A side and a protection plate or holding plate can be affixed to the resin.

[Modification 7]

A case wherein the pickup tape 26 is affixed and used instead of the dicing tape 22, and the discrete semiconductor chips 21-1, 21-2, 21-3, ... are picked up is explained as an example. However, it is also possible to directly separate the semiconductor chips from the dicing tape 22 and pick up the semiconductor chips.

With the method and the apparatus of the configuration described in the first to seventh modifications, basically the same operation and effect can be attained as those of the first to seventh embodiments.

As described above, according to one aspect of this invention, it is possible to provide a semiconductor device manufacturing method and apparatus with which damages caused by heat or cutting streaks formed on the side surface of the semiconductor chip can be reduced, and a deterioration in the characteristic of the semiconductor chip, occurrence of faults and a lowering in the resistance to bending or breaking can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing apparatus comprising:
    a damage forming equipment which forms damage layers used as starting points to divide a semiconductor wafer into discrete semiconductor chips on a rear surface side of the semiconductor wafer which is opposite to an element forming surface,
    a dividing equipment which divides the semiconductor wafer into discrete semiconductor chips with the damage layers used as the starting points, and
    a removing equipment which removes a rear surface portion of the semiconductor wafer to at least a depth where the damage layers are no more present.

2. The semiconductor device manufacturing apparatus according to claim 1, further comprising an affixing equipment which affixes a protection member to the element forming surface side of the semiconductor wafer.

3. The semiconductor device manufacturing apparatus according to claim 1, wherein the damage forming equipment includes a diamond blade which forms cut grooves in the rear surface portion of the semiconductor wafer.

4. The semiconductor device manufacturing apparatus according to claim 1, wherein the damage forming equipment includes a scriber which forms scratches or distortions on the rear surface of the semiconductor wafer.

5. The semiconductor device manufacturing apparatus according to claim 1, wherein the damage forming equipment includes a laser irradiation device which irradiates a laser beam to the rear surface side of the semiconductor wafer.

6. The semiconductor device manufacturing apparatus according to claim 5, further comprising a ice chuck which holds and cools the semiconductor wafer when the laser beam is irradiated from the laser irradiation device to the rear surface side of the semiconductor wafer.

7. The semiconductor device manufacturing apparatus according to claim 1, wherein the damage layers are formed in a direction corresponding to the crystallization direction of the semiconductor wafer.

8. The semiconductor device manufacturing apparatus according to claim 1, wherein the dividing equipment divides the semiconductor wafer into the discrete semiconductor chips by cleavage with the damage layers used as the starting points.

9. The semiconductor device manufacturing apparatus according to claim 2, wherein the dividing equipment further includes a stretching equipment which stretches the protection member and divides the semiconductor wafer into the discrete semiconductor chips with the damage layers used as the starting points by stretching the protection member by use of the stretching equipment.

10. The semiconductor device manufacturing apparatus according to claim 1, wherein the removing equipment includes a grinding device which grinds the rear surface portion of the semiconductor wafer to at least a depth where the damage layers are no more present.

11. The semiconductor device manufacturing apparatus according to claim 1, wherein the removing equipment includes a grinding device which grinds the rear surface portion of the semiconductor wafer and an etching device which etches the grinding surface ground by the grinding device and the rear surface portion of the semiconductor wafer is removed to at least a depth where the damage layers are no more present by grinding by use of the grinding device and etching by use of the etching device.

12. The semiconductor device manufacturing apparatus according to claim 1, wherein the removing equipment includes an etching device which etches the rear surface portion of the semiconductor wafer to at least a depth where the damage layers are no more present.

13. A semiconductor device manufacturing method comprising:

forming damage layers used as starting points to divide a semiconductor wafer into discrete semiconductor chips on a rear surface side of the semiconductor wafer which is opposite to an element forming surface, dividing the semiconductor wafer into discrete semiconductor chips with the damage layers used as the starting points, and removing a rear surface portion of the semiconductor wafer to at least a depth where the damage layers are no more present.

14. The semiconductor device manufacturing method according to claim 13, further comprising affixing a protection member to the element forming surface of the semiconductor wafer before forming the damage layers.

15. The semiconductor device manufacturing method according to claim 13, wherein forming the damage layers is to form cut grooves in the rear surface portion of the semiconductor wafer by use of a diamond blade.

16. The semiconductor device manufacturing method according to claim 13, wherein forming the damage layers is to form scratches or distortions on the rear surface of the semiconductor wafer by use of a scriber.

17. The semiconductor device manufacturing method according to claim 13, wherein forming the damage layers is to form re-crystallization regions on the rear surface of the semiconductor wafer by irradiating a laser beam to the rear surface side of the semiconductor wafer.

18. The semiconductor device manufacturing method according to claim 17, further comprising cooling the semiconductor wafer when the laser beam is irradiated to the rear surface side of the semiconductor wafer.

19. The semiconductor device manufacturing method according to claim 13, wherein forming the damage layers is to form re-crystallization regions in the semiconductor wafer by irradiating a laser beam to the rear surface side of the semiconductor wafer.

20. The semiconductor device manufacturing method according to claim 19, further comprising cooling the semiconductor wafer when the laser beam is irradiated to the rear surface side of the semiconductor wafer.

21. The semiconductor device manufacturing method according to claim 13, wherein forming the damage layers is carried out in a direction corresponding to the crystallization direction of the semiconductor wafer.

22. The semiconductor device manufacturing method according to claim 13, wherein dividing the semiconductor wafer into the discrete semiconductor chips is to cleave the semiconductor wafer by breaking into the discrete semiconductor chips.

23. The semiconductor device manufacturing method according to claim 14, wherein dividing the semiconductor wafer into the discrete semiconductor chips is to divide the semiconductor water into the discrete semiconductor chips by stretching the protection member.

24. The semiconductor device manufacturing method according to claim 13, wherein removing the rear surface portion to the depth where the damage layers are no more present is to grind the rear surface portion of the semiconductor wafer to at least a depth where the damage layers are no more present.

25. The semiconductor device manufacturing method according to claim 13, wherein removing the rear surface portion to the depth where the damage layers are no more present is to remove the rear surface portion of the semiconductor wafer to at least a depth where the damage layers are no more present by grinding the rear surface portion of the semiconductor wafer and etching the grinding surface.

26. The semiconductor device manufacturing method according to claim 13, wherein removing the rear surface portion to the depth where the damage layers are no more present is to etch the rear surface portion to at least a depth where the damage layers are no more present.

* * * * *